(12) United States Patent
Sharma et al.

(10) Patent No.: US 6,929,014 B2
(45) Date of Patent: Aug. 16, 2005

(54) METHOD AND APPARATUS FOR SINGLE DISC ULTRASONIC CLEANING

(75) Inventors: Amber Sharma, Fremont, CA (US); John Edgar Sheffield, Livermore, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 25 days.

(21) Appl. No.: 10/661,512

(22) Filed: Sep. 15, 2003

(65) Prior Publication Data

US 2004/0074514 A1 Apr. 22, 2004

Related U.S. Application Data

(62) Division of application No. 09/756,714, filed on Jan. 10, 2001, now Pat. No. 6,619,305.
(60) Provisional application No. 60/175,605, filed on Jan. 11, 2000.

(51) Int. Cl.[7] .................................................. B08B 3/12
(52) U.S. Cl. ....................... 134/1.3; 134/25.3; 134/34; 134/902
(58) Field of Search ...................... 134/1, 1.3, 25.3, 134/34, 902, 182–184

(56) References Cited

U.S. PATENT DOCUMENTS

| | | |
|---|---|---|
| 3,001,532 A | 9/1961 | Plassmeyer |
| 4,064,885 A | 12/1977 | Dussault et al. |
| 4,100,926 A | 7/1978 | Heim |
| 4,183,011 A | 1/1980 | Massa |
| 4,358,204 A | 11/1982 | Ellner |
| 4,409,999 A | 10/1983 | Pedziwiatr |
| 4,442,852 A | 4/1984 | Lord |
| 4,501,285 A | 2/1985 | Irwin et al. |
| 4,527,901 A | 7/1985 | Cook |
| 4,543,130 A * | 9/1985 | Shwartzman ................... 134/1 |
| 4,834,124 A | 5/1989 | Honda |
| 4,902,350 A | 2/1990 | Steck |
| 4,909,266 A | 3/1990 | Massa |
| 5,109,174 A | 4/1992 | Shewell |
| 5,113,881 A | 5/1992 | Lin et al. |
| 5,159,945 A | 11/1992 | Bannon |
| 5,286,657 A | 2/1994 | Bran |
| 5,322,082 A | 6/1994 | Shibano |
| 5,377,709 A | 1/1995 | Shibano |
| 5,379,785 A * | 1/1995 | Ohmori et al. .............. 134/184 |
| 5,383,483 A | 1/1995 | Shibano |
| 5,427,622 A | 6/1995 | Stanasolovich et al. |
| 5,617,887 A | 4/1997 | Shibano |
| 5,803,099 A | 9/1998 | Sakuta et al. |
| 5,849,091 A | 12/1998 | Skrovan et al. |
| 5,865,199 A | 2/1999 | Pedziwiatr et al. |
| 5,906,687 A | 5/1999 | Masui et al. |
| 5,911,232 A | 6/1999 | Mokuo et al. |
| 5,927,306 A | 7/1999 | Izumi et al. |
| 6,026,832 A * | 2/2000 | Sato et al. .................. 134/184 |
| 6,048,405 A | 4/2000 | Skrovan et al. |
| 6,220,259 B1 | 4/2001 | Brown et al. |
| 6,224,280 B1 * | 5/2001 | Buckley et al. ............. 400/613 |
| 6,244,280 B1 * | 6/2001 | Dryer et al. ............. 134/100.1 |

* cited by examiner

Primary Examiner—Joseph L Perrin
(74) Attorney, Agent, or Firm—McDermott Will & Emery LLP

(57) ABSTRACT

At least one ultrasonic treating apparatus adapted for treating a single workpiece and comprised of a relatively small tank with a sidewall-mounted ultrasonic transducer is provided. The tank may be provided with a movable partition for adjustably partitioning the tank into two sub-chambers, the partition being comprised of a material which is partially reflective and partially transmissive of ultrasonic energy supplied to a liquid within the tank. A reflector is provided within the tank for reflecting the acoustic energy either back to the movable partition or to a material which acts as an absorber of acoustic energy. In the former instance, the acoustic energy can be locally concentrated at a specific spacing from the ultrasonic transducer. In the latter instance, the effectiveness of ultrasonic treatment of the single workpiece is enhanced by favoring formation of progressive waves and minimizing formation of stationary waves.

7 Claims, 5 Drawing Sheets

METHOD AND APPARATUS FOR SINGLE DISC ULTRASONIC CLEANING

CROSS-REFERENCE TO PROVISIONAL APPLICATION

This application is a divisional of application Ser. No. 09/756,714, filed Jan. 10, 2001, now U.S. Pat. No. 6,619,305.

This application claims priority from U.S. provisional patent application Ser. No. 60/175,605 filed Jan. 11, 2000, the entire disclosure of which is incorporated herein by reference.

FIELD OF THE INVENTION

The present invention relates to apparatus and methods for treating workpieces with ultrasonic energy. More specifically, the present invention relates to apparatus and methods for performing ultrasonic cleaning of workpieces having a pair of opposed, planar surfaces, for example, disc-shaped workpieces. The invention has particular utility in the manufacture of disc-shaped magnetic and magneto-optic ("MO") recording media and semiconductor devices employing semiconductor wafer substrates.

BACKGROUND OF THE INVENTION

The ever-increasing areal recording densities of magnetic and MO recording media, as in the form of discs, results in continued reduction in the sizes of critical defects formed during the manufacturing process, which necessitate removal of particles having sizes (i.e., diameters) below about 0.5 $\mu$m. According to conventional practices utilizing ultrasonic and/or megasonic techniques for treating, e.g., cleaning, desmutting, etc., of such disc-shaped workpieces as are utilized as layer deposition substrates in the manufacture of various types of magnetic and MO recording media, as well as semiconductor integrated circuit (IC) devices processed from a single semiconductor wafer substrates, a plurality of discs are simultaneously processed in an ultrasonic tank in batches. Conventional ultrasonic apparatus for performing such batch cleaning operations typically comprise a stainless steel tank or vessel with several ultrasonic transducers attached to the bottom thereof. The ultrasonic transducers are driven by generators so as to vibrate at ultrasonic frequencies (~20–500 kHz) that create pressure waves in the cleaning liquid contained within the tank or vessel, which pressure waves in turn remove contaminants, particulate matter, etc., from the workpiece surfaces by different mechanisms. A simplified, schematic top plan view of a typical bottom-mounted transducer ultrasonic cleaning apparatus 10 comprising a rectangularly-shaped stainless steel tank 1 having a plurality of vertically oriented workpieces 2, e.g., discs, each having opposed, planar surfaces 2a and 2b, is shown in FIG. 1. The major advantage of the conventional batch method is that typically ca. 100–150 workpieces can be processed in about 300–360 sec.

However, such batch processing techniques utilizing bottom-mounted transducer ultrasonic cleaning apparatus as illustrated in FIG. 1 incur several disadvantages and drawbacks, including:

(1) the intensity of the ultrasonic (i.e., acoustic) energy field that a surface of a particular workpiece experiences is different for each disc, primarily as a result of the geometric arrangement of the discs and significant variation in the acoustic energy across the bottom of the tank or vessel, for example, arising from the formation of standing (or stationary) acoustic waves rather than progressive (or traveling) waves. For example, FIG. 2 illustrates the large variation in transmitted acoustic energy (measured in terms of power density, watts/unit area) across the bottom surface of a conventional ultrasonic apparatus employing a plurality of bottom-mounted ultrasonic transducers; and (2) the relatively large tanks or vessels of conventional batch-type ultrasonic treatment apparatus contain a considerable amount of cleaning liquid or bath, which liquid bath is, on average, utilized for a very long interval, typically about 10–12 hours, before being replaced with fresh cleaning solution. However, as the workpieces (e.g., discs) are processed in the tank, particulate matter and other contaminants, such as soluble and/or insoluble materials, are removed from the workpiece surfaces and become suspended and/or dissolved in the cleaning solution, thereby increasing the likelihood of particle redeposition, damage to the workpiece surfaces arising from the mechanical abrading action exerted thereon by the suspended particles, and a general reduction in effectiveness of the cleaning/removal properties of the cleaning bath or solution due to exhaustion of the active ingredients or components thereof, e.g., surfactants, detergents, etc. As a consequence, in order to extend the effectiveness of the cleaning solution, the latter is typically recirculated through a filter, which filter has a further disadvantage of incurring contaminant loading necessitating periodic cleaning and/or replacement of the filter material or cartridge.

SUMMARY OF THE INVENTION

Accordingly, there exists a clear need for improved apparatus and methodology for performing simple, reliable, rapid, and cost-effective ultrasonic treatment of workpieces, e.g., disc-shaped workpieces used as deposition substrates in the manufacture of magnetic and/or MO recording media and semiconductor wafer substrates utilized in the fabrication of semiconductor IC devices, which apparatus and methodology avoids the drawbacks and disadvantages associated with use of the conventional, batch-type, bottom transducer-mounted ultrasonic devices, and provides, inter alia, single-disc ultrasonic processing where each disc is subjected to the same amount/intensity of acoustic energy providing equal removal forces; relatively small tank or vessel sizes facilitating rapid and frequent cleaning bath replacement, filtering, or replenishment; elimination of "dead spaces" of very low acoustic power within the tank or vessel due to reduction or elimination of disadvantageous stationary wave formation and enhanced formation of progressive waves; obtainment of production economies resulting from lower cost and maintenance of a bank of relatively small ultrasonic tanks operating in parallel, vis-à-vis a single large tank; and smaller impact on product throughput than which results upon malfunction of a single large tank.

The present invention, wherein the reflection and transmission characteristics of ultrasonic waves supplied to a liquid contained in a relatively small chamber or tank via a sidewall-mounted transducer and simultaneously applied to the opposing surfaces of a single planar workpiece, e.g., a disc-shaped workpiece such as a deposition surface of a substrate for a magnetic or MO recording medium or a semiconductor wafer, are manipulated to locally increase the acoustic power density and/or formation of progressive waves, effectively addresses and solves the above-stated need for improved methodology and instrumentalities for performing ultrasonic treatment of planar-surfaced workpieces. Further, the methodology and apparatus provided by the instant invention can be implemented in a cost-effective manner utilizing readily available materials and components, and the methodology and apparatus afforded by the present invention enjoy diverse utility in the manufacture of numerous types of manufacturing processes in addition to those specifically enumerated.

An advantage of the present invention is an improved apparatus for treating surfaces of a single workpiece with ultrasonic energy.

Another advantage of the present invention is an improved apparatus for treating a single workpiece having a pair of opposed, planar surfaces with ultrasonic energy.

Yet another advantage of the present invention is an improved method for treating surfaces of a single workpiece with ultrasonic energy.

Still another advantage of the present invention is an improved method for treating a single workpiece having a pair of opposed, planar surfaces with ultrasonic energy.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by an apparatus for treating surfaces of a single workpiece with ultrasonic energy, comprising:

(a) a chamber defining an interior space for containing therein a liquid, the chamber comprising a bottom wall and a first pair of opposing, longitudinally extending sidewalls connected by a second pair of opposing, transversely extending sidewalls;

(b) an ultrasonic wave energy applying means for supplying ultrasonic wave energy to a liquid contained within the interior space of the chamber, the ultrasonic wave energy applying means including a planar transducing surface forming at least a portion of a first one of the second pair of opposing, transversely extending sidewalls; and (c) a workpiece mounting means within the interior space of the chamber for mounting therein a single workpiece, the workpiece mounting means comprising means for mounting a single workpiece comprising a pair of opposed, planar surfaces, such that the pair of opposed, planar surfaces are oriented perpendicularly to the planar transducing surface of the ultrasonic wave energy applying means for simultaneously receiving therefrom ultrasonic energy.

In embodiments according to the present invention, the workpiece mounting means (c) comprises means for mounting a disc-shaped substrate; and the apparatus further comprises an acoustic waveguide means at least partially surrounding the planar transducing surface of the ultrasonic wave energy applying means for increasing the power density of ultrasonic energy supplied to the liquid.

According to embodiments of the invention, the apparatus further comprises ultrasonic energy reflecting means located within the interior space; and movable partition means transversely extending at least partway between the first pair of opposing, longitudinally extending sidewalls for adjustably partitioning the interior space into first and second sub-spaces each extending for a desired, adjustable length along the first pair of longitudinally extending sidewalls, the movable partition means being comprised of a material (e.g., a sheet of a polyurethane material) which is partially reflective and partially transmissive of ultrasonic wave energy; and the workpiece mounting means (c) is adapted to be selectively positioned within either the first sub-space or the second sub-space.

According to an embodiment of the present invention, the ultrasonic energy reflecting means comprises the second one of the second pair of transversely extending, opposing sidewalls for reflecting ultrasonic energy back to the movable partition means; whereas according to another embodiment of the present invention, the ultrasonic energy reflecting means comprises a contoured surface ultrasonic reflector for reflecting ultrasonic energy away from the movable partition means and onto an ultrasonic energy absorbing means located within the interior space, thereby increasing the formation of progressive ultrasonic energy waves within the interior space while decreasing the formation of standing ultrasonic energy waves.

According to further embodiments of the present invention, the apparatus further comprises workpiece supplying/withdrawal means for inserting the workpiece mounting means into the interior space and for withdrawing the workpiece mounting means from the interior space after a predetermined interval for treatment of a workpiece; and a liquid supply means including recirculation and filter means for recirculating and filtering liquid contained in the chamber and/or for supplying fresh liquid to the chamber.

According to another aspect of the present invention, a system for treating a plurality of workpieces each having a pair of opposed, planar surfaces comprises a plurality of the above-described ultrasonic energy treating apparatuses fluidly connected in parallel.

According to yet another aspect of the present invention, a method of treating a single workpiece having a pair of opposed, planar surfaces with ultrasonic energy comprises the steps of:

(a) providing an apparatus comprising:
 (i) a chamber having an interior space containing therein a liquid, the chamber comprising a bottom wall and a first pair of opposing, longitudinally extending sidewalls connected by a second pair of opposing, transversely extending sidewalls;
 (ii) an ultrasonic wave energy applying means for supplying ultrasonic energy to the liquid in the chamber, the ultrasonic wave energy applying means including a planar transducing surface forming at least a portion of a first one of the second pair of opposing, transversely extending sidewalls; and
 (iii) a workpiece mounting means positioned within the interior space of the chamber for mounting therein a single workpiece comprising a pair of opposed, planar surfaces, such that the pair of surfaces are oriented perpendicularly to the planar transducing surface at a preselected spacing therefrom;

(b) positioning within the interior space a workpiece mounting means having a single workpiece, such that each of the pair of workpiece surfaces is in contact with the liquid; and (c) applying ultrasonic energy from the planar transducing surface to the liquid for simultaneous treatment of each of the pair of workpiece surfaces.

According to embodiments of the present invention, step (c) further includes reflecting ultrasonic energy applied from the planar transducing surface to the liquid via reflective means located within the interior space; and step (a)(i) further comprises providing a movable partition means within the interior space, the movable partition means extending transversely at least partway between the first pair of opposing, longitudinally extending sidewalls for adjustably partitioning the interior space into a first sub-space including the planar transducing surface and a second sub-space including the second one of the second pair of opposing, transversely extending sidewalls, each of the first and second sub-spaces extending for a desired, adjustable length along the first pair of longitudinally extending sidewalls, the movable partition means being comprised of a material which is partially reflective and partially transmissive of ultrasonic energy; and step a(iii) further comprises positioning the workpiece mounting means in either the first sub-space or the second sub-space at a spacing from the transducing surface which provides the pair of substrate surfaces with a desired amount of ultrasonic power.

According to an embodiment of the present invention, step (c) comprises reflecting the ultrasonic energy back to the movable partition means; whereas according to another embodiment of the present invention, step (c) comprises reflecting the ultrasonic energy away from the movable partition means and onto an ultrasonic energy absorbing means located within the interior space, thereby increasing the formation of progressive ultrasonic waves within the interior space while decreasing the formation of standing ultrasonic waves.

According to particular embodiments of the present invention, step (a)(i) comprises providing a movable partition means comprising a sheet of a polyurethane or other suitable material; step (a)(iii) comprises positioning said workpiece mounting means within the second sub-chamber; and step (b) comprises providing a disc-shaped substrate.

According to still another aspect of the present invention, an apparatus for treating surfaces of a single workpiece with ultrasonic energy comprises:

(a) a chamber comprising a bottom and a plurality of pairs of planar sidewalls, the chamber including a planar ultrasonic transducing surface forming at least a portion of one of the sidewalls; and (b) means for mounting a single workpiece having a pair of opposed, planar surfaces such that the pair of surfaces are oriented perpendicularly to the planar ultrasonic transducing surface.

According to embodiments of the present invention, the apparatus further comprises:

(c) movable partition means within the chamber for adjustably partitioning the chamber into two sub-chambers and comprised of a material which is partially reflective and partially transmissive of ultrasonic wave energy; and (d) reflector means within the chamber for reflecting ultrasonic wave energy back to the partition means or to an ultrasonic energy absorber located within the chamber.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention is based upon the discovery that a single dual planar-sided workpiece, e.g., a disc-shaped substrate for use in magnetic recording media or a semiconductor wafer utilized in fabrication of IC devices, can be rapidly and cost-effectively subjected to ultrasonic treatment, e.g., for cleaning, desmutting, particulate removal, etc., by means of apparatus and methodology which avoid the aforementioned drawbacks and disadvantages associated with the use of batch ultrasonic treatment techniques utilizing relatively large tanks or vessels. According to the invention, the relatively large tanks with bottom-mounted ultrasonic transducers for simultaneously processing a large plurality of disc-shaped workpieces are replaced with at least one ultrasonic treating apparatus comprised of a relatively small tank with a sidewall-mounted ultrasonic transducer. The at least one tank may be provided with a movable partition for adjustably partitioning the tank or vessel into two sub-chambers, the partition being comprised of a material which is partially reflective and partially transmissive of ultrasonic (i.e., acoustic) energy supplied to a liquid within the tank via the ultrasonic transducer. A key feature of the present invention is the further provision of a reflector means within the tank for reflecting the acoustic energy either back to the movable partition or to a material which acts as an absorber of acoustic energy. In the former instance, by appropriate selection of the material of the movable partition, the acoustic energy can be locally concentrated or focussed at a specific spacing (or spacings) from the ultrasonic transducer, at which spacing the single workpiece is positioned for receiving a desired amount of acoustic energy for effecting high quality ultrasonic treatment thereof in a minimum time interval. In the latter instance, the effectiveness of ultrasonic treatment of the single workpiece is enhanced by favoring formation of progressive (i.e., traveling) waves and minimizing formation of stationary (i.e., standing) waves. In either instance, the single workpiece is positioned by means of a suitable workpiece holder, in the sub-chamber providing the greater acoustic energy intensity for maximizing treatment effectiveness. In addition, the smaller ultrasonic tank size according to the invention facilitates rapid and more frequent liquid bath exchange or replenishment, thereby minimizing deleterious effects arising from bath contamination occurring over long periods of use.

Figure 1:
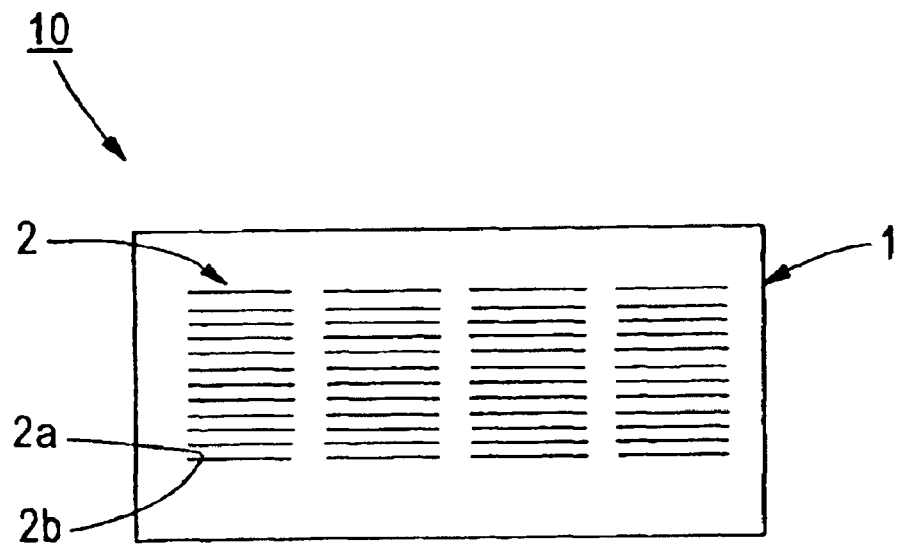
FIG. 1 is a simplified, schematic top plan view of a conventional bottom-transducer ultrasonic processing apparatus for batch treatment of a plurality of disc-shaped workpieces.
Figure 2:
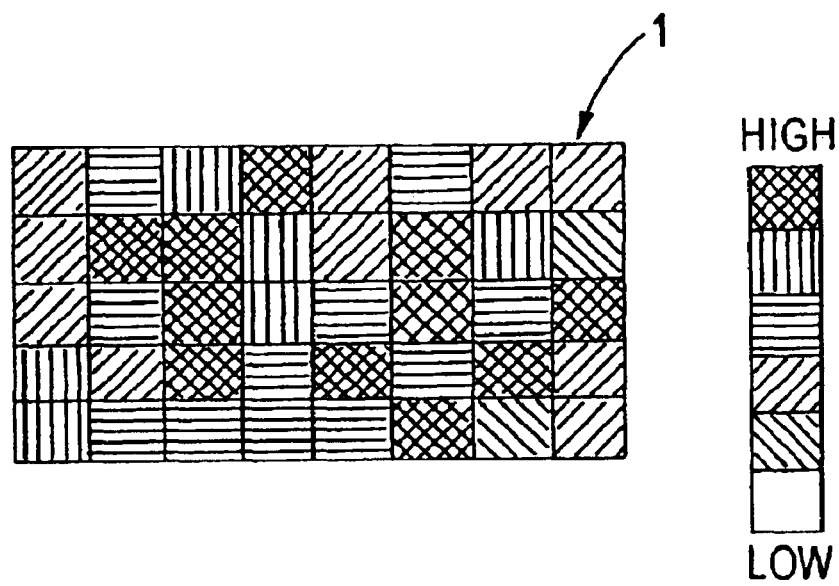
FIG. 2 is a diagram illustrating the variation in transmitted ultrasonic energy across the bottom surface of the conventional bottom-transducer ultrasonic processing apparatus of FIG. 1.
Figure 3:
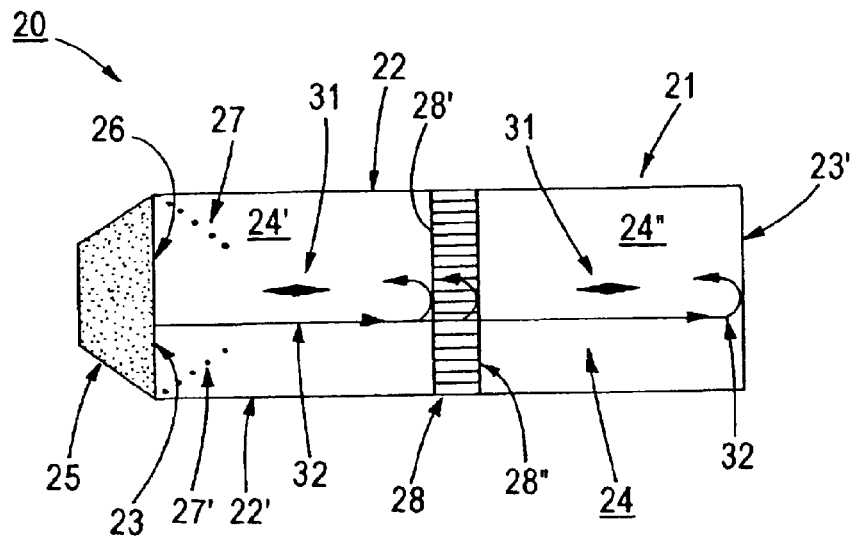
FIG. 3 is a simplified, schematic top plan view of an embodiment of a single-disc ultrasonic treatment apparatus according to the present invention.
Figure 4:
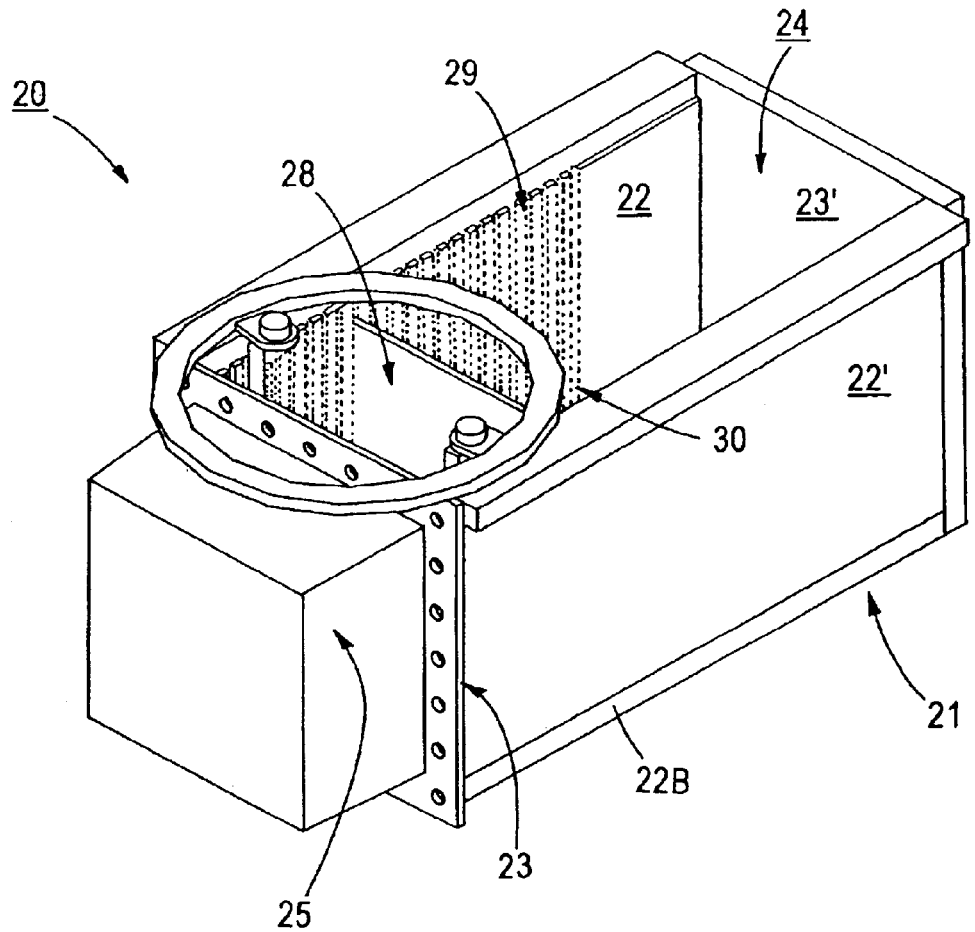
FIG. 4 is a more detailed, perspective view of the embodiment of FIG. 3.

Referring now to FIGS. 3–4, which respectively show simplified schematic top plan and more detailed perspective views of an embodiment of the present invention, a basic ultrasonic system 20 according to the invention comprises a rectangular parallelepiped-shaped treatment tank or vessel 21 formed of, e.g., stainless steel or other suitable substantially mechanically robust and inert material, having a bottom wall 22B, a first pair of opposed, longitudinally extending, upstanding sidewalls 22, 22' and a second pair of opposed, transversely extending, upstanding sidewalls 23, 23' together defining an interior space 24. An ultrasonic transducer means 25 is provided at one end of the tank or vessel 21 and is connected to a source of ultrasonic (i.e., acoustic) energy (not shown in the drawings for simplicity). Ultrasonic transducer means 25 includes a planar transducing surface 26 facing the interior of the tank 21 and forming at least a part of a transversely extending sidewall 23. If desired, a pair of inwardly facing, converging acoustic reflectors 27, 27' may be provided at opposite peripheral edges of the planar transducing surface 26 for functioning as acoustic waveguides for concentrating (i.e., focussing) the acoustic energy within a central region of tank 21.

By way of illustration only, a suitable ultrasonic system for use in the present invention may comprise one or more submersible ultrasonic transducers bonded, via flanges, to one side of a stainless steel (e.g., type 316L stainless) plate or sheet and electrically connected to a 104 kHz generator and wave step transformer (such as available form CAE Ultrasonics, Jamestown, N.Y.). In such instance, the ultrasonic transducer system includes a planar transducing surface 26 forming part or all of transverse sidewall 23.

According to the invention, ultrasonic system 20 further includes a longitudinally movable, transversely extending partition 28 which partitions interior space 24 into first and second sub-chambers 24', 24", respectively. As best seen from FIG. 4, adjustment of the longitudinal position of partition 28 is facilitated by provision of a plurality of parallel, vertically extending, spaced-apart grooves 29 along the inwardly facing surface of each of the pair of longitudinally extending sidewalls 22, 22' for accommodating opposing lateral edges of the partition. Partition 28 comprises a material which is partially reflective and partially transmissive of ultrasonic (i.e., acoustic) energy supplied via the planar transducing surface 26 to a bath liquid contained within the interior space 24 (or sub-chambers 24', 24") of the tank or vessel 21. By way of illustration only, grooves 29 may be formed in the inwardly facing surfaces of the longitudinally extending sidewalls 22, 22' at about ⅛ in. intervals and the movable partition 28 formed of a sheet of a metallic material, e.g., a stainless steel such as type 316L, or a sheet of a polymeric material, e.g., polyurethane, polypropylene, PVDF, etc.

System 20 also includes a workpiece holder 30 (see FIG. 4 in particular) for vertically positioning a dual planar-sided workpiece 31, such as a disc-shaped substrate, in either interior sub-space 24' or 24" of tank or vessel 24, at a selected longitudinal spacing from planar transducing surface 26. Workpiece holder 30 can accommodate a single workpiece 31 having a pair of opposed, planar surfaces such that the latter can be oriented at a desired angle to the planar transducing surface 26. However, according to the invention, the planar surfaces of workpiece 31 are preferably oriented perpendicularly (i.e., at 90°) to the planar transducing surface 26 in order to subject each surface to substantially the same exposure to ultrasonic waves (e.g., progressive or travelling waves) generated within the bath liquid according to a feature of the present invention.

According to the invention, during operation of system 20, a first portion of the ultrasonic wave energy 32 supplied from the planar transducing surface 26 to the bath liquid is reflected back towards the planar transducing surface 26 at the proximal surface 28' of the movable partition 28 (defining the distal transverse wall of the first sub-chamber 24') and a second portion of the ultrasonic wave energy 32 is transmitted through the partition 28. In turn, a first portion of the transmitted ultrasonic wave energy 32 is reflected at the distal surface 28" of the partition 28 (forming the proximal transverse wall of the second sub-chamber 24") back towards the planar transducing surface 26 and a second portion of the transmitted ultrasonic wave energy 32 is reflected back towards the movable partition 28 at the transversely extending sidewall 23'.

The distance between the movable partition 28 and the planar transducing surface 26 and the material thereof can be optimized for use in a particular situation to controllably alter the ultrasonic (or acoustic) pressure in each of the sub-chambers 24', 24". The choice of material for use as partition 28 depends upon its acoustic impedance relative to that of the bath liquid, typically water, and its coefficient of acoustic absorption. The single workpiece can be positioned in either sub-chamber 24' or 24", depending upon the lateral position of the region of maximum acoustic energy. Other factors to be taken into account in obtaining optimal ultrasonic treatment of dual planar-sided workpieces utilizing system 20 include, inter alia, frequency and amplitude of the ultrasonic energy, disc orientation (preferably perpendicular to the planar transducing surface 26), insonation interval, and ultrasonic generator parameters, e.g., duty cycle, pulse width, etc. However, it should be recognized that provision of the movable partition 28 to the basic sidewall-mounted transducer+distal wall (i.e., transverse wall 23') configuration of system 20 of FIGS. 3–4 for forming sub-chambers 24' and 24" is optional and not a requirement for obtaining the desired concentration/localization of acoustic energy/power for treatment of a single workpiece having a pair of opposed, planar surfaces.

Figure 5:
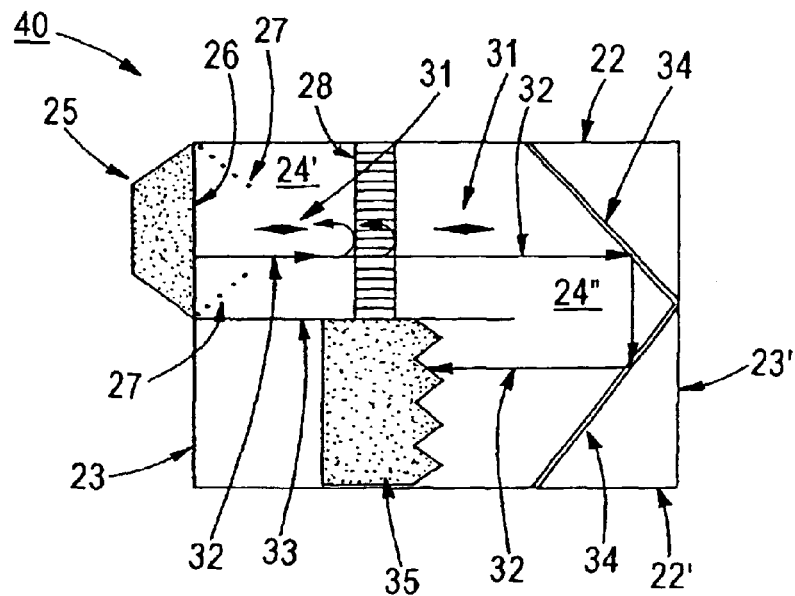
FIG. 5 is a simplified, schematic top plan view of another embodiment of a single-disc ultrasonic treatment apparatus according to the present invention.
Figure 6:
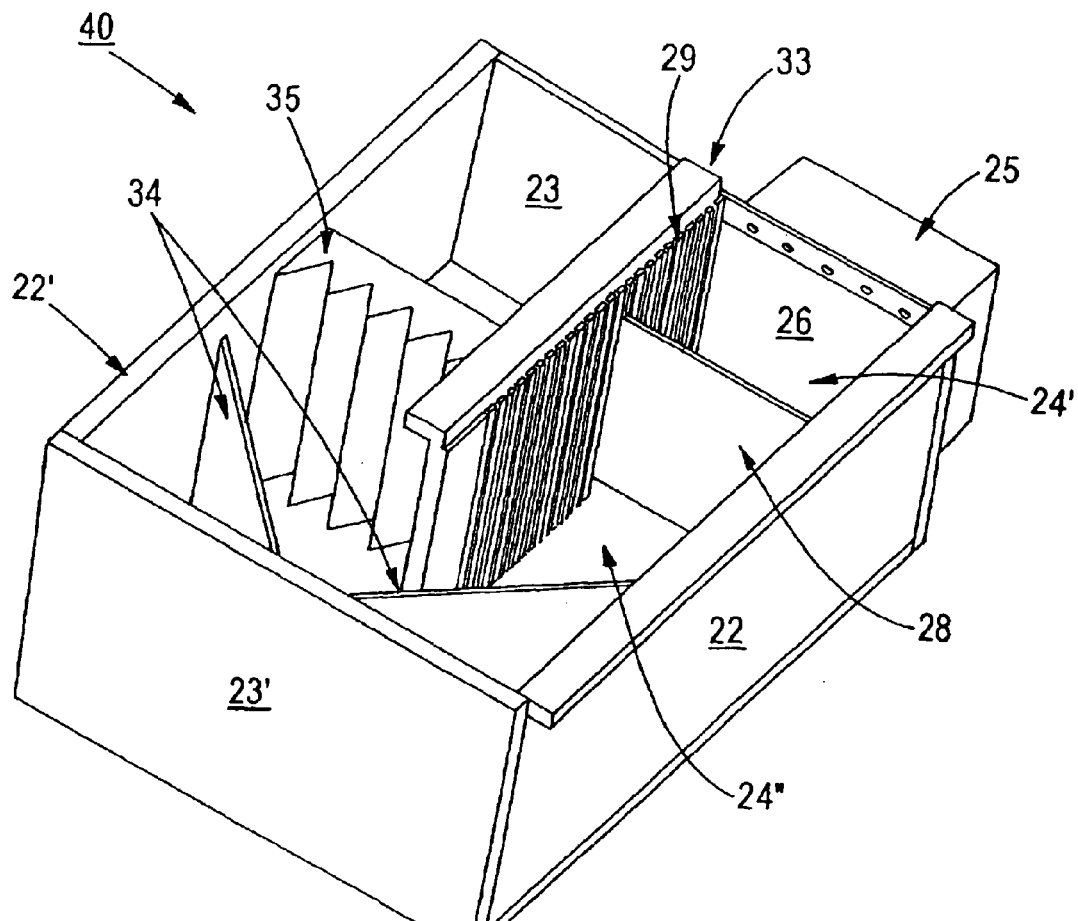
FIG. 6 is a more detailed, perspective view of the embodiment of FIG. 5.

Another embodiment of an ultrasonic workpiece treatment system 40 according to the invention is illustrated in very simplified, schematic plan view in FIG. 5 and in more detailed, perspective view in FIG. 6, in which like reference numerals are utilized for designating features similar to those of FIGS. 3–4, which features are not described in detail for brevity. System 40 differs in essential respect from system 20 in the provision of a separate, contoured surface reflector 34, illustratively a V-shaped reflector (e.g., formed of stainless steel), at the distal end of the second sub-chamber 24" for reflecting ultrasonic wave energy 32 transmitted through the movable partition 28 onto an acoustic absorber body 35 (e.g., of a material such as polyurethane foam) located within the second sub-chamber 24" at a location off-set from the insonation path 32. In addition, system 40 is provided with an interiorly disposed, longitudinally extending, upstanding wall 33 having a plurality of vertically extending, parallel spaced-apart grooves 29 formed in a surface thereof for adjustably vertically positioning movable partition 28. As shown, wall 33 extends only partway into the interior space in order not to block reflection of ultrasonic waves 32 from reflector 34 to absorber 35. Finally, system 40 utilizes a workpiece holder for a single workpiece similar to that illustrated in FIG. 4.

Each of the above-described systems 20 and 40 may be equipped with: (a) workpiece supplying/withdrawal means (not shown in the drawing figures in order not to unnecessarily obscure the internal structure thereof) for inserting the workpiece mounting means into the interior space of the chamber and for withdrawing the workpiece mounting means from the interior space after a predetermined interval of ultrasonic treatment of the workpiece; and (b) liquid supply means (also not shown in the drawing figures in order not to unnecessarily obscure the internal structure thereof) including recirculation and filter means for recirculating and filtering liquid in the chamber and/or for supplying fresh liquid to the chamber.

Figure 8:
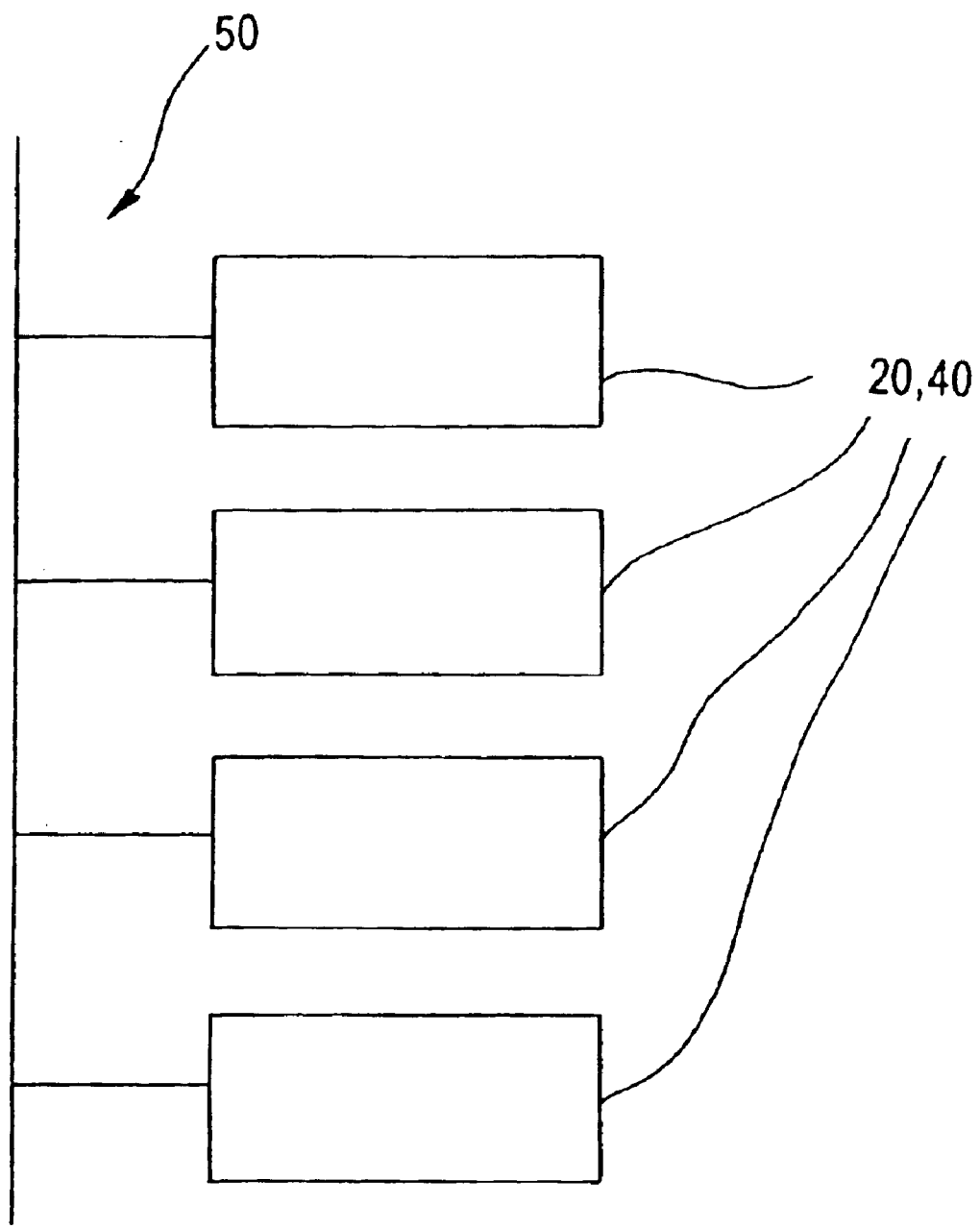
FIG. 8 is a simplified, schematic view of a system comprising a plurality of ultrasonic energy treating apparatuses fluidly connected in parallel, according to one embodiment of the present invention.

In addition, a system 50 comprising a plurality of the above-described ultrasonic treating apparatuses 20,40 fluidly connected in parallel may be utilized for simultaneously performing ultrasonic processing of a plurality of workpieces, as illustrated in FIG. 8.

A number of advantages are provided by the above-described arrangement of system 40 wherein acoustic waves traveling from the planar transducing surface 26 are reflected from the contoured surface reflector 34 onto the absorber body 35, including, inter alia, enhanced generation of progressive (i.e., travelling) acoustic waves within the liquid bath, and concomitant reduced generation of standing (i.e., stationary) acoustic waves. Generation of progressive ultrasonic waves is considered advantageous in that such type waves are capable of exerting pressure on small-dimensioned particles removed from the workpiece surfaces and suspended in the treatment bath to direct them away from the planar transducing surface 26. Selection of appropriate acoustic energy parameters, as described supra, can increase the pressure exerted on the suspended particles to enable their capture and/or collection by a suitable collector, thereby minimizing redeposition of the particles on the workpiece surfaces. As before, provision of the movable partition 28 for forming sub-chambers 24' and 24" is optional and not a requirement for obtaining the desired increase in generation of progressive ultrasonic waves.

Figure 7:
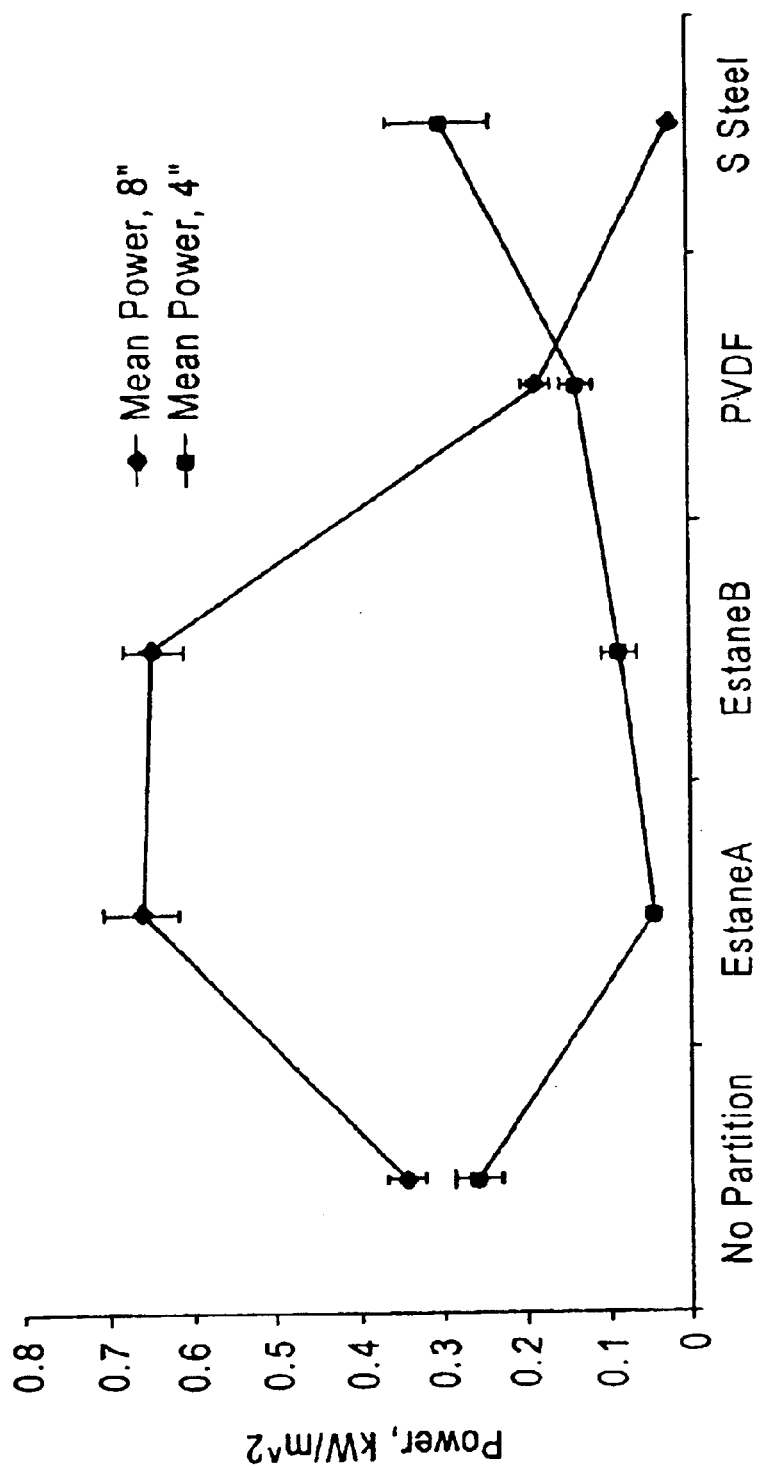
FIG. 7 is a graph showing the average acoustic power distributions for different movable partition materials obtained with the embodiment of FIGS. 3–4.

FIG. 7 illustrates, in graphical form, the variation of acoustic power in a liquid bath with distance from a sidewall-located planar transducer surface, as a function of various partition materials, obtained for a system such as shown in FIGS. 3–4 utilizing deionized ("DI") water for the liquid bath, and as measured by means of a hydrophone. More specifically, the average acoustic power within the DI water was measured at distances of 4 and 8 inches from the ultrasonic transducer by means of a hydrophone positioned at a constant height above the tank bottom. As is apparent from the figure, polyurethane-based partition materials (identified in the graph as Estane™ A and Estane™ B, products of B.F. Goodrich Co., Cleveland, Ohio) are notable for providing a high post-partition concentration of acoustic energy and thus are considered particularly useful partition materials for use in practice of the present invention.

A number of advantages are thus provided by the present invention, including, but not limited to, performing ultrasonic treatment of disc-shaped workpieces or substrates such that each disc experiences the same removal forces; the relatively small tank size of the inventive apparatus facilitates performing rapid and frequent bath exchanges, in turn resulting in reduced contaminant build-up; specific design features according to the invention maximize generation of advantageous progressive ultrasonic energy waves while minimizing formation of less useful stationary ultrasonic energy waves, thereby eliminating formation of "dead-spaces" in the tank where acoustic power drops to very low values; the small tank size lowers system initial and maintenance costs; and a bank of small tanks operating in parallel will suffer smaller impact upon malfunction of a particular tank than when a single large tank is utilized.

In the previous descriptions, numerous specific details are set forth, such as particular materials, structures, processes, etc., in order to provide a thorough understanding of the present invention, however, it should be recognized that the present invention can be practiced without resorting to the details specifically set forth. For example, the methodologies and instrumentalities of the present invention are not limited to use with disc-shaped workpieces such as are utilized in the manufacture of magnetic recording media and semiconductor IC devices, but rather are applicable to all manner of workpieces, e.g., printed circuit substrates. In other instances, well-known materials, devices, and structures have not been described herein in detail in order not to unnecessarily obscure the present invention.

Only the preferred embodiments of the present invention are shown and described herein. It is to be understood that the present invention is capable of use in various other combinations and environments and is susceptible of changes and/or modifications within the scope of the inventive concepts as expressed herein.

What is claimed is:

1. A method of treating a workpiece having a pair of opposed, planar surfaces with ultrasonic energy, comprising the steps of:

(a) providing an apparatus comprising:

(i) a chamber having an interior space containing therein a liquid, said chamber comprising a bottom wall and a first pair of opposing, longitudinally extending sidewalls connected by a second pair of opposing, transversely extending sidewalls, and a movable partition within said interior space, said movable partition extending transversely at least partway between said first pair of opposing, longitudinally extending sidewalls for adjustably partitioning said interior space into a first sub-space including a planar transducing surface and a second sub-space including said second one of said second pair of opposing, transversely extending sidewalls, each of said first and second sub-spaces extending for a desired, adjustable length alone said first pair of longitudinally extending sidewalls, said movable partition being comprised of a material which is partially reflective and partially transmissive of ultrasonic energy;

(ii) an ultrasonic wave energy applying means for supplying ultrasonic energy to said liquid in said chamber, said ultrasonic wave energy applying means including said planar transducing surface forming at least a portion of a first one of said second pair of opposing, transversely extending sidewalls; and (iii) a workpiece mounting means positioned within said interior space of said chamber for mounting therein a workpiece, wherein said workpiece mounting means is positioned in either said first sub-space or said second sub-space at a spacing from said transducing surface which provides said pair workpiece surfaces with a desired amount of ultrasonic power;

(b) positioning within said interior space a said workpiece mounting means having a said workpiece, such that each of said pair of workpiece surfaces is in contact with said liquid; and (c) applying ultrasonic energy from said planar transducing surface to said liquid for simultaneous treatment of each of said pair of workpiece surfaces.

2. The method as in claim 1, wherein:

step (c) further includes reflecting ultrasonic energy applied from said planar transducing surface to said liquid via means for reflecting ultrasonic energy located within said interior space.

3. The method as in claim 1, wherein:

step (c) comprises reflecting said ultrasonic energy back to said movable partition.

4. The method as in claim 1, wherein:

step (c) comprises reflecting said ultrasonic energy away from said movable partition and onto an ultrasonic energy absorbing means located within said interior space, thereby increasing the formation of progressive ultrasonic waves within said interior space while decreasing the formation of standing ultrasonic waves.

5. The method as in claim 1, wherein:

step (a)(i) comprises providing a movable partition comprising a sheet of a polyurethane material; and step (a)(iii) comprises positioning said workpiece mounting means within said second sub-space.

6. The method as in claim 1, wherein:

step (b) comprises providing a disc-shaped substrate.

7. The method as in claim 1, wherein said workpiece mounting means comprises means for mounting a workpiece, said workpiece comprising a pair of opposed, planar surfaces, such that said pair of opposed, planar surfaces are oriented perpendicularly to said planar transducing surface of said ultrasonic wave energy applying means for simultaneously receiving therefrom ultrasonic energy.

* * * * *